(12) United States Patent
Reiner

(10) Patent No.: US 9,577,056 B2
(45) Date of Patent: Feb. 21, 2017

(54) SEMICONDUCTOR COMPONENT COMPRISING AT LEAST ONE CONTACT STRUCTURE FOR FEEDING IN AND/OR LEADING AWAY CHARGE CARRIERS

(71) Applicant: Fraunhofer-Gesellschaft zur Forderung der angewandten Forschung e.V., Munich (DE)

(72) Inventor: Richard Reiner, Freiburg (DE)

(73) Assignee: Fraunhofer-Gesellschaft zur Forderung der angewandten Forschung e.V., München (DE)

( * ) Notice: Subject to any disclaimer, the term of this patent is extended or adjusted under 35 U.S.C. 154(b) by 0 days.

(21) Appl. No.: 14/432,271

(22) PCT Filed: Sep. 28, 2012

(86) PCT No.: PCT/EP2012/069285
§ 371 (c)(1),
(2) Date: Mar. 30, 2015

(87) PCT Pub. No.: WO2014/048504
PCT Pub. Date: Apr. 3, 2014

(65) Prior Publication Data
US 2015/0243743 A1   Aug. 27, 2015

(51) Int. Cl.
*H01L 29/417* (2006.01)
*H01L 29/423* (2006.01)
(Continued)

(52) U.S. Cl.
CPC ...... *H01L 29/41758* (2013.01); *H01L 27/088* (2013.01); *H01L 29/2003* (2013.01);
(Continued)

(58) Field of Classification Search
CPC ................................. H01L 29/41758
See application file for complete search history.

(56) References Cited

U.S. PATENT DOCUMENTS 8,958,246 B2 * 2/2015 Pan .................. G11O 5/02
257/390
2005/0189562 A1   9/2005 Kinzer et al.
(Continued)

FOREIGN PATENT DOCUMENTS

EP     2180520     4/2010
FR     2832548     5/2003

OTHER PUBLICATIONS

Reiner, R. et al., "Fractal Structures for Low-Resistance Large Area AlGaN/GaN Power Transistors", Power Semi-Conductor Devices and ICS (ISPSD), 2012 24th International Symposium on, IEEE, Jun. 3, 2012, pp. 341-344.

*Primary Examiner* — Eugene Lee

(57) ABSTRACT

A semiconductor component having at least one first contact structure for feeding in and/or leading away charge carriers in relation to the semiconductor component, which first contact structure has at least one contact-making point for electrically conductively connecting the first contact structure to an external terminal, and which first contact structure has at least one first-order branching point proceeding from the contact-making point, at which first-order branching point at least one first-order subsequent conduction track branches off. Each first-order subsequent conduction track has at least one second-order branching point, at which second-order branching point at least one second-order subsequent conduction track branches off, and the electrical through-conduction resistance of each second-order subsequent conduction track is higher than the electrical through-conduction resistance of the first-order subsequent conduction track connected to said second-order subsequent conduction track via a common second-order branching point.

18 Claims, 5 Drawing Sheets

(51) Int. Cl.
*H01L 29/778* (2006.01)
*H01L 29/20* (2006.01)
*H01L 31/068* (2012.01)
*H01L 27/088* (2006.01)

(52) U.S. Cl.
CPC ...... *H01L 29/4238* (2013.01); *H01L 29/7786* (2013.01); *H01L 31/0682* (2013.01); *Y02E 10/547* (2013.01)

(56) References Cited

U.S. PATENT DOCUMENTS

| | | | |
|---|---|---|---|
| 2006/0006480 A1* | 1/2006 | Shinozaki | H01L 23/5286 257/401 |
| 2012/0008400 A1* | 1/2012 | Fukuzumi | G11C 16/0483 365/185.18 |
| 2012/0119219 A1 | 5/2012 | Takado et al. | |
| 2015/0041922 A1* | 2/2015 | Takahashi | G11C 7/12 257/401 |
| 2016/0013179 A1* | 1/2016 | Miura | H01L 23/528 257/401 |

* cited by examiner

SEMICONDUCTOR COMPONENT COMPRISING AT LEAST ONE CONTACT STRUCTURE FOR FEEDING IN AND/OR LEADING AWAY CHARGE CARRIERS

BACKGROUND

The invention relates to a semiconductor component comprising at least one first contact structure for feeding in and/or leading away charge carriers in relation to the semiconductor component.

Semiconductor components are used for diverse applications, in particular in the embodiment as a transistor or a diode. The invention relates to such semiconductor components which comprise at least one first contact structure for feeding in and/or leading away charge carriers in relation to the semiconductor component. The contact structure is typically embodied as a metallic contact structure.

In this case, the metallic contact structure typically makes contact with one or a plurality of semiconductor layers, in particular one or a plurality of doped regions of the semiconductor layers. For electrically connecting the semiconductor component to further components and/or an external circuit, the contact structure has at least one contact-making point. It is known to produce an electrically conductive connection via such a contact-making point for example by means of bonding, via cell connectors, hot tips or other contacting methods.

In order to feed charge carriers to the semiconductor component or lead them away therefrom areally, comb-like metallic contact structures are known. The latter have approximately the shape of a comb by virtue of the fact that the contact structure has a plurality of successive first-order branching points proceeding from a contact-making point, at which first-order branching points in each case at least one metallic subsequent conduction track (the "fingers" of the comb) branches off. Such structures are known for example in the case of power transistors or in the case of photovoltaic solar cells.

Due to the rising demand for electrical power, growing energy costs and increasing environmental awareness, there is a need for optimized, cost-effective, highly efficient and reliable semiconductor components. Particularly in the case of transistors, higher switching frequencies and the reduction of power losses are desirable. An increase in efficiency is always striven for correspondingly in the case of photovoltaic solar cells, for example.

SUMMARY

Therefore, the present invention is based on the object of providing a semiconductor component comprising an improved contact structure for feeding in and/or leading away charge carriers in relation to the semiconductor component. This object is achieved by means of a semiconductor component. Preferred configurations of the semiconductor component according to the invention are found in the claims. The wording of the claims is hereby explicitly incorporated by reference in the description.

The semiconductor component according to the invention comprises at least one first contact structure for feeding in and/or leading away charge carriers in relation to the semiconductor component. The first contact structure comprises at least one contact-making point for electrically conductively connecting the first contact structure to an external terminal. In this case, the contact-making point can be embodied in a particular way, for example with a larger area and/or a different material, for example as a soldering pad. Likewise, the contact-making point can merely be the location at which contact is made in the manner mentioned above.

Proceeding from the contact-making point, the contact structure has at least one first-order branching point, preferably a plurality of successive first-order branching points, at which first-order branching point in each case at least one first-order subsequent conduction track branches off. In the preferred embodiment having a plurality of first-order branching points, at least one first-order subsequent conduction track branches off at each of said branching points. This basic construction accords for example with the previously known comb structure described above, which is described in N. Ikeda, Y. Niiyama, H. Kambayashi, Y. Sato, T. Nomura, S. Kato, S. Yoshida, "GaN Power Transistors on Si Substrates for Switching Applications", in Proc. Of the IEEE, Vol: 98, No: 7, pp: 1151-1161, July 2010.

What is essential is that, in the case of the first contact structure of the semiconductor component according to the invention, each first-order subsequent conduction track has at least one second-order branching point, at which second-order branching point at least one second-order subsequent conduction track branches off. In this case, the first contact structure is embodied in such a way that the electrical through-conduction resistance of each second-order subsequent conduction track is higher than the electrical through-conduction resistance of the first-order subsequent conduction track connected to said second-order subsequent conduction track via a common second-order branching point.

The invention is based on the insight that, surprisingly, two effects lead to a considerable improvement in the previously known contact structures:

Firstly, the area efficiency can be considerably improved by the provision of at least first- and second-order branching points and subsequent conduction tracks. Secondly, the configuration such that the electrical through-conduction resistance of a higher-order subsequent conduction track is higher than the electrical through-conduction resistance of the next-lower-order conduction track assigned via the common branching point leads to an approximately homogeneous electrical power decrease at the first contact structure during operation. Surprisingly, the combination of the two effects mentioned above has a particularly positive outcome:

A homogeneous power decrease also brings about an areally homogeneous heat dissipation, that is to say a homogeneous power loss, such that loadings of the semiconductor component as a result of temperature differences are avoided or at least reduced and a more efficient temperature regulation and areal dissipation of heat are made possible. The combination of area efficiency and homogeneous power loss increases the cost-effectiveness during production of the semiconductor component and also the reliability and lifetime. Furthermore, the new contact structure of the semiconductor component according to the invention leads to an advantageous impedance matching. As a result, reflections on the structure are reduced, which improves the dynamic stability of the component. Furthermore, the broadband characteristics are improved as a result of the impedance matching, which affords advantages particularly in radio-frequency applications.

The semiconductor component according to the invention thus overcomes the disadvantage that a higher complexity of a contact structure over and above the previously known comb structure reduces the cost-effectiveness. Rather, the semiconductor component according to the invention affords a number of advantages which, particularly in combination, bring about surprising positive effects as described above.

In the context of this application, the designation "electrical through-conduction resistance" describes the through-conduction resistance of a conduction track in the main current direction. The conduction tracks are typically configured in a line-like fashion, in particular preferably in a rectilinear fashion. The conduction tracks thus typically have a high length-to-width ratio. The electrical through-conduction resistance thus typically describes the conduction resistance in the direction of the longitudinal extent of the conduction track.

The change in the conduction resistance can be obtained in various ways: in this regard, it lies within the scope of the invention to change the conduction resistance by changing the cross-sectional area, in particular the cross-sectional area perpendicular to the main current direction of the conduction track. It is particularly advantageous in this case for the width of the conduction tracks to be embodied differently in order to achieve the respective desired through-conduction resistance. For this means that the conduction tracks can have substantially an identical height and differ only in width. This results in simpler and more cost-effective process conditions. However, it likewise also lies within the scope of the invention to choose the through-conduction resistance accordingly by changing both the height and the width of the conduction track.

In a further advantageous embodiment, the conduction resistance is preselected by means of the choice of materials. In this regard, it is advantageous to embody the subsequent conduction tracks of a specific order, for example all the second-order subsequent conduction tracks, in a different material with respect to the first-order subsequent conduction tracks, wherein the material of the second-order subsequent conduction tracks has a higher resistivity compared with the resistivity of the material used for the first-order subsequent conduction track. The use of different materials for subsequent conduction tracks of different orders has the advantage that the area efficiency is increased: by way of example, first-order subsequent tracks of the semiconductor component according to the invention have a lower electrical through-conduction resistance than second-order subsequent tracks. With use of the same material for the first- and second-order subsequent tracks, the cross-sectional area, for example the width of the first-order subsequent tracks, must accordingly be greater than that of the second-order subsequent tracks. By contrast, if a material having a lower resistivity is used for the first-order subsequent tracks, compared with the material of the second-order subsequent tracks, then the first-order subsequent tracks can be embodied with a smaller cross-sectional area, for example smaller width, in comparison with the example mentioned above, with the result that a higher area efficiency is obtained.

It likewise lies within the scope of the invention for the respectively desired through-conduction resistances to be formed both by means of different materials and by embodying the conduction track with different dimensions, in particular different cross-sectional areas.

As already described above, one particular advantage of the contact structure of the semiconductor component according to the invention resides in a substantially homogeneous electrical conduction resistance power loss. Preferably, therefore, the through-conduction resistances of the subsequent conduction tracks are chosen in such a way that during operation of the semiconductor component the electrical conduction resistance power loss of each second-order subsequent conduction track deviates by less than 10%, preferably less than 5%, more preferably less than 1%, from the electrical conduction resistance power loss of the first-order subsequent conduction track connected to said second-order subsequent conduction track via a common second-order branching point. In particular, it is advantageous that the average electrical conduction resistance power losses of all the first- and second-order conduction tracks, preferably of all the conduction tracks, of the first contact structure deviate from one another by less than 10%, preferably less than 5%, more preferably less than 1%.

The power loss in a conduction track is proportional to the square of the electric current flow. Preferably, the through-conduction resistances of the subsequent conduction tracks are chosen in such a way that during operation of the semiconductor component the current density of each subsequent conduction track deviates by less than 10%, preferably less than 5%, more preferably less than 1%, from the current density of the first-order subsequent conduction track connected to said second-order subsequent conduction track via a common second-order branching point. In particular, it is advantageous that the average electrical conduction resistance power losses of all the first- and second-order subsequent conduction tracks, in particular of all the subsequent conduction tracks of the first contact structure, deviate from one another by less than 10%, preferably less than 5%, more preferably less than 1%. As a result, the substantially homogeneous electrical conduction resistance power loss described above is obtained in a simple manner.

In the context of this application, the term "during operation" and analogous terms denote operating states of the semiconductor component which are typical of the use of the semiconductor component with charge carriers being fed in or led away via the first contact structure. By way of example, one typical operating state is the "on" state in the case of transistors or the illuminated state with emission of electrical power in the case of solar cells.

Typically, in the case of semiconductor components, the current intensity which flows to a conduction track from an assigned semiconductor layer or is fed into said semiconductor layer by means of the conduction track is approximately proportional to an area of the semiconductor layer that is assigned to said conduction track. Preferably, therefore, each subsequent conduction track is assigned an active partial area of the semiconductor component and the through-conduction resistance of each subsequent conduction track is proportional to the square of the reciprocal of the partial area assigned to said subsequent conduction track. As a result, the approximately homogeneous current density of the subsequent conduction tracks described above is obtained in a simple manner.

The advantageous effects of the semiconductor component according to the invention as described initially are already obtained in the case of configuration of the contact structure having the second-order subsequent conduction tracks, as described above. A further analogous continuation of such branching, i.e. the provision of correspondingly further higher-order branching points and subsequent conduction tracks, is particularly advantageous. In this case, the higher-order branching points and subsequent conduction tracks are embodied analogously to the second-order branching points and subsequent conduction tracks as described above, or analogously to preferred embodiments thereof.

In one preferred embodiment of the semiconductor component according to the invention, therefore, each second-order subsequent conduction track has at least one third-order branching point, at which third-order branching point at least one third-order subsequent conduction track branches off. Analogously to the configuration of the lower-order subsequent conduction tracks, the through-conduction resistance of each third-order subsequent conduction track is higher than the electrical through-conduction resistance of the second-order subsequent conduction track connected to said third-order subsequent conduction track via a common second-order branching point. With further preference, the configuration of the contact structure is extended by fourth-order branching points and conduction tracks by virtue of the fact that in analogous continuation each third-order subsequent conduction track has at least one branching point corresponding to fourth-order subsequent conduction tracks formed.

Investigations by the applicant have revealed that in particular the configurations of the contact-making structure having an order in the range of second order to fifth order as the highest order is advantageous.

A particularly high area efficiency is obtained if at least two, preferably exactly two, second-order subsequent conduction tracks branch off at the branching points at least starting from the second order. In particular, it is advantageous for the two subsequent conduction tracks to branch off in mutually opposite directions, in particular on opposite sides of the assigned low-order subsequent conduction track, such that a double comb structure is formed. In particular, in an analogous continuation it is advantageous that at least two, preferably exactly two, n-th order subsequent conduction tracks branch off at each branching point having an order n>1. A high area efficiency is obtained as a result.

A structure that can be realized particularly simple and is nevertheless efficient arises by virtue of the subsequent conduction tracks branching off at right angles at the branching points, i.e. forming a right angle with the assigned lower-order subsequent conduction track at the common branching point.

A particularly efficient structure arises by virtue of the subsequent conduction tracks branching off at the branching points at an angle in the range of 30° to 60°, i.e. forming an angle in the range of 30° to 60° with the assigned lower-order subsequent conduction track at the common branching point.

A particularly efficient configuration of the first contact structure arises by virtue of the fact that advantageously the first contact structure is embodied in a self-similar fashion at least in partial regions, preferably completely. Such self-similar or fractal structures are distinguished by the fact that basic patterns on a higher scale are found again in a self-similar manner in the smaller structures on smaller scale ranges. The definition of such self-similar structures is described for example in B. B. Mandelbrot, "The Fractal Geometry of Nature", W.H. Feeman & Co., ISBN 0-7167-1186-9, 1982.

The first contact structure is therefore preferably embodied as an at least third-, more preferably at least fourth-order fractal structure.

As described above, the semiconductor component according to the invention comprises a first contact structure in a novel configuration according to the invention. Preferably, further contact structures of the semiconductor component according to the invention, with particular preference all the contact structures of the semiconductor component, are embodied in an analogous manner:

In one preferred embodiment, the semiconductor component comprises a second contact structure for feeding in and/or leading away charge carriers in relation to the semiconductor component. The second contact structure is preferably embodied analogously to the first contact structure. The second contact structure therefore likewise has a contact-making point and also subsequent conduction tracks and branching points of at least first and second orders, as described above with respect to the first contact structure. In particular, the second contact structure is preferably embodied analogously to an advantageous embodiment of the first contact structure described above.

For a large number of semiconductor components it is known to provide two metallic contact structures in each case in the form of a comb structure, wherein the two comb structures are arranged in a manner interlaced in one another. Such interdigitated comb structures can preferably serve as an initial structure for forming one preferred embodiment of the semiconductor component according to the invention by virtue of the fact that first and second contact structures are embodied and arranged in a manner interlaced in one another as described above. This arrangement interlaced in one another brings about a particularly high area efficiency, without the first contact structure intersecting the second contact structure, i.e. there is no need to provide electrical insulations in the plane or parallel to the plane of the semiconductor layers between first and second contact structures.

Preferably, therefore, first and second contact structures are embodied as an at least third-, preferably at least fourth-order fractal structure proceeding from an interdigitated double comb structure as second-order comb structure.

As already described above, the novel contact structure of the semiconductor component according to the invention leads to an advantageous impedance matching. This advantage is afforded in particular by virtue of the fact that, in one advantageous embodiment, the first contact structure, in particular the electrical through-conduction resistances of the conduction tracks, is embodied in such a way that the impedance rule below, explained with regard to formula (1), is fulfilled:

The conduction tracks are preferably embodied in such a way that the following condition is fulfilled for segments of the conduction track. Such a segment is delimited by a first branching point facing the contact-making point, and a second branching point facing away from the contact-making point, wherein the first and second branching points are adjacent.

Advantageously, the impedance $Z_0$ of this segment of a conduction track between a first and a second branching point is chosen in such a way that the sum of the reciprocals of the impedances $Z_i$ of the conduction tracks connected in parallel at the second branching point is equal to the reciprocal of the impedance $Z_0$, in accordance with the following formula 1:

$$\frac{1}{Z_0} = \sum_{i=1}^{n} \frac{1}{Z_i}. \tag{1}$$

In this case, n denotes the number of conduction tracks connected in parallel at the second branching point, and $Z_i$ correspondingly denotes the impedance of the branching off conduction track i. Conduction tracks connected in parallel are, for example, the higher-order conduction tracks branching off from the second branching point. Likewise, in the case of a conduction track continued at the second branching point, this continued region should be regarded as a conduction track connected in parallel.

If, by way of example, in the case of a first-order subsequent conduction track, the first-order subsequent conduction is continued at the second branching point (which is a second-order branching point) and two second-order subsequent conduction tracks branch off at said branching point, then three conduction tracks connected in parallel are present, i.e. n=3. By contrast, if the first-order subsequent conduction track is not continued at the second branching point, then two conduction tracks connected in parallel are correspondingly present, i.e. n=2.

The contact structure of the semiconductor component according to the invention is particularly advantageous in the case of the configuration of the semiconductor component as a transistor, in particular as a lateral transistor, having substantially lateral current flows between drain and source. In particular, the configuration of the semiconductor component as a bipolar transistor or field effect transistor is advantageous.

Investigations by the applicant have revealed that the advantages mentioned initially is advantageous in particular for the configuration of the semiconductor component as an HFET (Hetero Junction Field Effect Transistor) and in this case in particular in the case of GaN-based transistors. The configuration of such a transistor is described for example in N. Ikeda et al., "GaN Power Transistors on Si Substrates for Switching Applications", to which reference has already been made.

Preferably, therefore, the first contact structure is embodied as a drain contact-connection or as a source contact-connection of the transistor. In particular, it is advantageous for the first contact structure to be embodied as a drain contact-connection and for the second contact structure to be embodied as a source contact-connection of the transistor.

A further improvement of such a semiconductor component according to the invention embodied as a transistor arises by virtue of the gate contact-connection also being embodied analogously to the first contact structure described above. Alternatively or additionally, it is advantageous for the gate contact-connection to be embodied at least regionally in the form of meanders strung together. This results in fewer crossover points of gate and source metallization. Furthermore, rounded meander shapes reduce electric field spikes; the breakdown behavior in the off-state region can be improved as a result.

As already described, the advantages of the semiconductor component according to the invention are manifested particularly in the case of the configuration of the semiconductor component as a power transistor. Preferably, therefore, the semiconductor component is embodied as a power transistor comprising a plurality of subtransistors. In particular, it is advantageous that each conduction track of the highest order of the first contact structure is assigned subtransistors, preferably is assigned exactly one subtransistor.

The advantages mentioned above have a particularly positive outcome in the case of large-area semiconductor components. Preferably, therefore, the semiconductor component according to the invention is embodied as a large-area transistor, photovoltaic solar cell, illumination area or large-area sensor.

Preferably, the conduction tracks are embodied in such a way that the electrical through-conduction resistance is increased in a stepped manner at each branching point. Such a configuration is already known in the case of the comb structures described above and is typically designated as a "tapered" conduction track. Such a comb structure is described for example in R. Reiner, F. Benkhelifa, D. Krausse, R. Quay, and O. Ambacher, "Simulation and Analysis of Low Resistance AlGaN/GaN HFET Power Switches," in Proc. EPE'11, paper 570, p. 1-10, September 2011. In one particularly simple, advantageous embodiment, the width of the conduction track decreases in a stepped manner at each branching point, such that the through-conduction resistance correspondingly increases on account of the decreasing cross-sectional area. As a result, an approximately homogeneous electrical power loss is realized along a conduction track since an increase in the current flow at a branching point on account of this or the subsequent conduction tracks branching off at said branching point is compensated for by a corresponding change in the through-conduction resistance at said branching point, in particular a corresponding widening.

Preferably, at least the second-order, with preference the first- and second-order, subsequent conduction tracks, with further preference all the subsequent conduction tracks, as described above, are embodied with a through-conduction resistance changing in a stepped manner at each branching point.

Preferably, the first and/or the second contact-making structure are/is embodied as metallic contact-making structure. With further preference, all the contact-making structures of the semiconductor component are embodied as metallic contact-making structures. It likewise lies within the scope of the invention for one or a plurality of the contact structures, in particular the first contact structure, to be embodied from one or a plurality of nonmetallic, conductive materials, in particular from one or a plurality of conductive polymers, from one or a plurality of semiconductor layers, in particular doped semiconductor layers, and/or one or a plurality of doped partial regions of one or a plurality of semiconductor layers. It likewise lies within the scope of the invention for one or a plurality of the contact-making structures to be embodied from a combination of metallic and nonmetallic materials.

BRIEF DESCRIPTION OF THE DRAWINGS

Further preferred features and advantageous embodiments are explained below on the basis of exemplary embodiments with metallic contact-making structures and the figures, in which.

In the figures, identical reference signs designate identical or identically acting elements. For the sake of better illustration, the figures have been drawn up schematically and without being true to scale.

DETAILED DESCRIPTION OF THE PREFERRED EMBODIMENTS

FIGS. 1a to 1e schematically illustrate a first exemplary embodiment of a semiconductor component according to the invention in small parts and partial excerpts. The semiconductor component is embodied as a GaN-based heterojunction field effect transistor (HFET). The embodiment and configuration of the first exemplary embodiment is described in R. Reiner, P. Waltereit, F. Benkhelifa, S. Müller, H. Walcher, S. Wagner, R. Quay, M. Schlectweg, O. Ambacher, "Fractal Structures for Low Resistance Large Area AlGaN/GaN Power Transistors", Proceedings of the 2012 24th International Symposium on Power Semiconductor Devices and ICs, 3-7 Jun. 2012,—Bruges, Belgium. Reference is made to the full scope of this cited reference.

The transistor is embodied in a manner known per se with regard to the basic construction. What is essential is that the metallic contact structures source, gate and drain are embodied in a particular way, as described below.

Figure 1A:
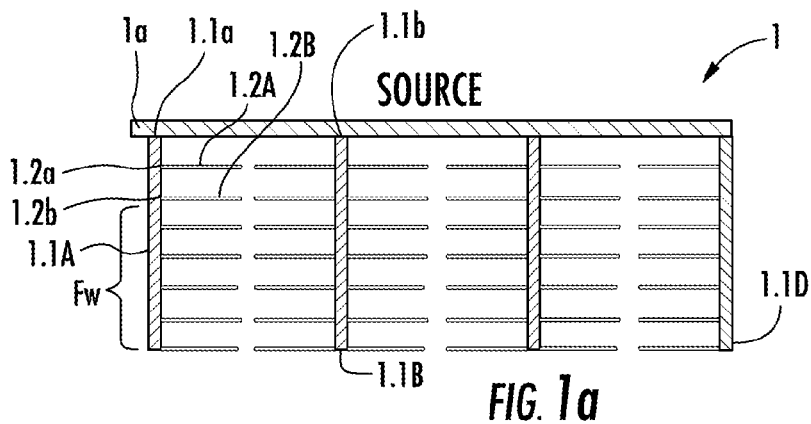
FIGS. 1a-1e show schematic partial illustrations of a first exemplary embodiment of a semiconductor component according to the invention, embodied as a field effect transistor.
Figure 1B:
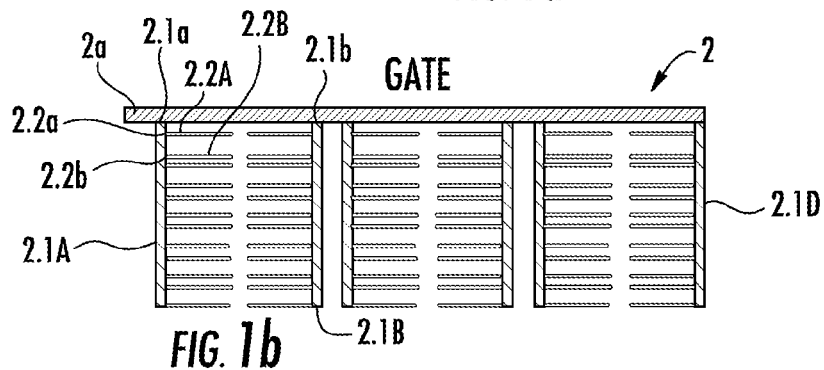
Figure 1C:
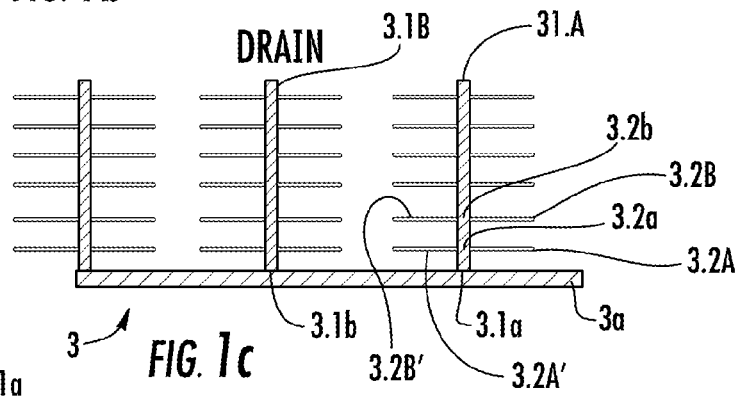
Figure 1D:
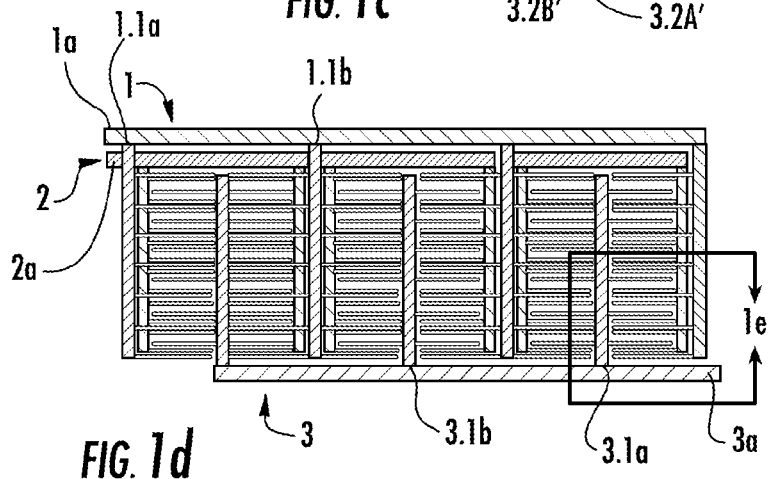
Figure 1E:
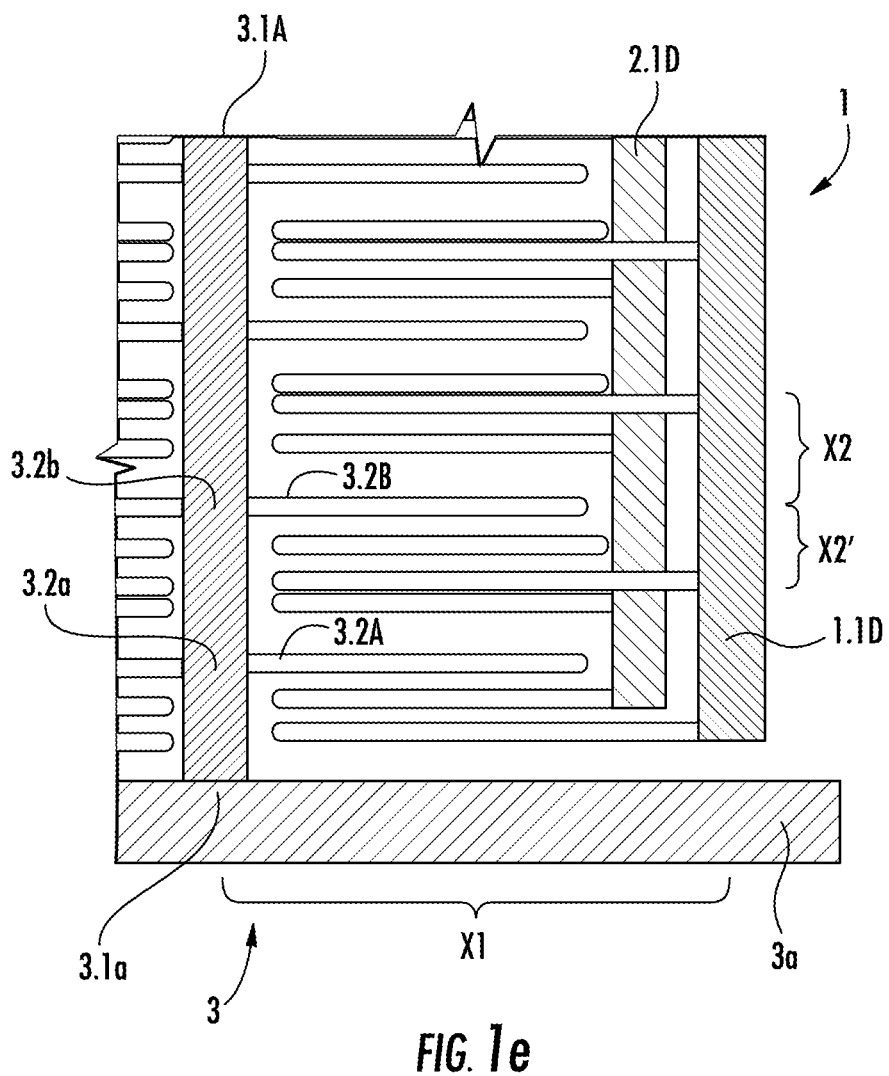

For the sake of better illustration, the individual contact structures are illustrated separately in FIG. 1a to 1c. FIG. 1d shows the contact structures in the actual arrangement, interlaced in one another, on the semiconductor component. FIG. 1e shows the region identified in FIG. 1d as an enlarged excerpt.

FIG. 1a shows a source contact structure 1 having a contact-making point 1a for electrically conductively connecting the source contact structure 1 to an external terminal, in particular by means of a bonding wire.

Proceeding from the contact-making point 1a, the source contact structure 1 has a plurality of successive first-order branching points, the first two branching points 1.1a and 1.1b being provided with reference signs by way of example.

A respective metallic first-order subsequent conduction track branches off at the first-order branching points (1.1a, 1.1b), wherein, by way of example, the subsequent conduction track 1.1A branching off from the first-order branching point 1.1a in the case of the and the first-order subsequent conduction track 1.1B branching off from the first-order branching point 1.1b and the last first-order subsequent conduction track 1.1D are identified by reference signs.

With regard to this basic structure, the source contact structure 1 corresponds to a comb structure known per se.

What is essential is that each first-order subsequent conduction track has a plurality of second-order branching points. By way of example, second-order branching points 1.2a and 1.2b of the first-order subsequent conduction track 1.1A are provided with reference signs. At least one second-order subsequent conduction track branches off at each second-order branching point. By way of example, a second-order subsequent conduction track 1.2A branching off from the second-order branching point 1.2a and a second-order subsequent conduction track 1.2B branching off from the second-order branching point 1.2b are identified by reference signs.

As is furthermore evident from FIG. 1a, in each case exactly one second-order subsequent conduction track branches off from each second-order branching point (1.2a, 1.2b) of the outer first-order subsequent conduction tracks (1.1A and 1.1D).

In each case two second-order subsequent conduction tracks branch off from the inner first-order subsequent conduction tracks, such as the subsequent conduction track 1.1B, for example, at each second-order branching point, wherein the second-order subsequent conduction tracks branching off from a second-order branching point extend in a mirror-inverted fashion on opposite sides of the associated first-order subsequent conduction track.

The illustration in accordance with FIG. 1a merely schematically illustrates the fact that the electrical through-conduction resistance of each second-order subsequent conduction track is higher than the electrical through-conduction resistance of the first-order subsequent conduction track connected to said second-order subsequent conduction track via a common second-order branching point. By way of example, the width of the second-order subsequent conduction track 1.2A is illustrated as smaller compared with the width of the first-order subsequent conduction track 1.1A connected to said second-order subsequent conduction track 1.2A via the second-order common branching point 1.2a. This schematically illustrates the fact that the actual width of the second-order subsequent conduction track 1.2A is also less than the width of the first-order subsequent conduction track 1.1A. Since the first- and second-order subsequent conduction tracks have approximately the same height, the second-order subsequent conduction track 1.2A thus has a small cross-sectional area and thus a higher through-conduction resistance compared with the first-order subsequent conduction track 1.1A. This analogously holds true for the ratio of all the subsequent conduction tracks of different orders illustrated in FIGS. 1 and 2 with respect to one another.

The gate contact structure 2 illustrated in FIG. 1b is embodied analogously to the source contact structure 1, with a contact-making point 2a, first-order branching points (for example 2.1a and 2.1b), first-order subsequent conduction tracks (for example first-order subsequent conduction tracks 2.1A, 2.1B and 2.1D), with second-order branching points (for example second-order branching points 2.2a and 2.2b of the first-order subsequent conduction track 2.1A), and second-order subsequent conduction tracks (for example the second-order subsequent conduction track 2.2A branching off from the second-order branching point 2.2a and the subsequent conduction track 2.2B branching off from the second-order branching point 2.2b).

In contrast to the source contact structure 1, in the case of the gate contact structure 2, exactly one second-order subsequent conduction track (2.2A, 2.2B) branches off from each second-order branching point (2.2a, 2.2b).

The drain contact structure 3 illustrated in FIG. 1c is likewise embodied analogously to the source contact structure 1, with a contact-making point 3a, first-order branching points (identified for example by 3.1a and 3.1b), first-order subsequent conduction tracks (identified for example by 3.1A and 3.1B), second-order branching points (for example second-order branching points 3.2a and 3.2b of the first-order subsequent conduction track 3.1A), and second-order subsequent conduction tracks (for example a second-order subsequent conduction track 3.2A branching off from the second-order branching point 3.2a and a second-order subsequent conduction track 3.2B branching off from the second-order branching point 3.2b).

In the case of the drain contact structure 3, there branch off from each second-order branching point (3.2a, 3.2b) exactly two second-order subsequent conduction tracks (3.2A and 3.2A' from branching point 3.2a; 3.2B and 3.2B' from branching point 3.2b), wherein the subsequent conduction tracks extend in a mirror-inverted fashion with respect to one another on opposite sides of the second-order branching point of the assigned first-order subsequent conduction track.

FIG. 1d illustrates the actual arrangement of the contact structures 1, 2 and 3: the source contact structure 1 and drain contact structure 3 are arranged in a manner interlaced in one another, without said contact structures touching or intersecting.

The gate contact structure 2 is led through in part above or below one of the other contact structures, wherein at least in these regions electrically insulating layers are respectively arranged between the contact structures.

FIG. 1e illustrates an enlarged view of the partial excerpt identified in FIG. 1d, with an additionally identified first-order subsequent conduction track 1.1D of the source contact structure 1 and first-order subsequent conduction track 2.1D of the gate contact structure 2.

The widths of the first- and second-order subsequent conduction tracks of the contact structures 1, 2, 3 are chosen in such a way that in the operating state of the transistor with switched gate, i.e. on state, the conduction resistance power loss of the second-order subsequent conduction tracks of a contact structure are approximately equal to the conduction resistance power loss of the first-order subsequent conduction tracks of said contact structure.

This results in a homogeneous current flow and approximately homogeneous heat dissipation during operation.

The homogeneous current flow prevents or at least reduces in particular disadvantages of current crowding effects, as described for example in R. Reiner, F. Benkhelifa, D. Krausse, R. Quay, and O. Ambacher, "Simulation and Analysis of Low Resistance AlGaN/GaN HFET Power Switches," in Proc. EPE'11, paper 570, p. 1-10, September 2011.

Measurements results concerning the first exemplary embodiment of a semiconductor component according to the invention are described in the above-referenced R. Reiner, et al., "Fractal Structures for Low Resistance Large Area AlGaN/GaN Power Transistors", loc. cit., in particular in section IV and FIGS. 7 and 8.

The embodiment of the contact structures 1 to 3 as illustrated in FIG. 1e additionally has the advantage, however, that the impedances of the individual partial regions are matched. This results in an improved dynamic switching behavior, in particular at high frequencies. Switching losses are minimized as a result and operation of the transistor is possible at higher frequencies compared with previously known transistors comprising conventional contact structures. Measurement results concerning the dynamic behavior are explained in above-referenced R. Reiner, et al., "Fractal Structures for Low Resistance Large Area AlGaN/GaN Power Transistors", loc. cit., in particular in FIGS. 9 to 12 and the associated description in section IV.

The improved impedance behavior described above is obtained by virtue of the fact that the following holds true for the first-order subsequent conduction tracks:

The impedance $Z_0$ of each segment of a first-order subsequent conduction track between a first and a second branching point is chosen in such a way that the sum of the reciprocals of the impedances $Z_i$ of the conduction tracks connected in parallel at the second branching point is equal to the reciprocal of the impedance $Z_0$. In this case, a segment is delimited by the first branching point facing the contact-making point 1a, and the second branching point facing away from the contact-making point. First and second branching points are adjacent.

By way of example, in the illustration in accordance with FIG. 1a, for that segment of the first-order subsequent conduction track 1.1A that is delimited by the first branching point 1.2a and the second branching point 1.2b, it holds true that the sum of the reciprocals of the impedances $Z_1$ and $Z_2$ of the conduction tracks connected in parallel at the second branching point 1.2B is equal to the reciprocal of the impedance $Z_0$ of the above-described segment. Proceeding from the branching point 1.2b, firstly there extends the second-order subsequent conduction track 1.2B having the impedance $Z_1$. However, the first-order subsequent conduction track 1.1A is likewise continued at the branching point 1.2b, such that that partial region of the first-order subsequent conduction track 1.1A which is identified by in FIG. 1a is connected in parallel with the second-order subsequent conduction track 1.2B with respect to the branching point 1.2b and an impedance $Z_2$ can be assigned to the partial region $F_w$.

The through-conduction values and configurations of these conduction tracks are therefore chosen in such a way that the reciprocal of the impedance $Z_0$ is to the sum of the reciprocal of the impedance Z1 of the second-order subsequent conduction track 1.2B and the reciprocal of the impedance Z2 of that region of the continued first-order subsequent conduction track 1.1A which is identified by $F_w$ together with the second-order subsequent conduction tracks subsequently branching off.

Figure 2:
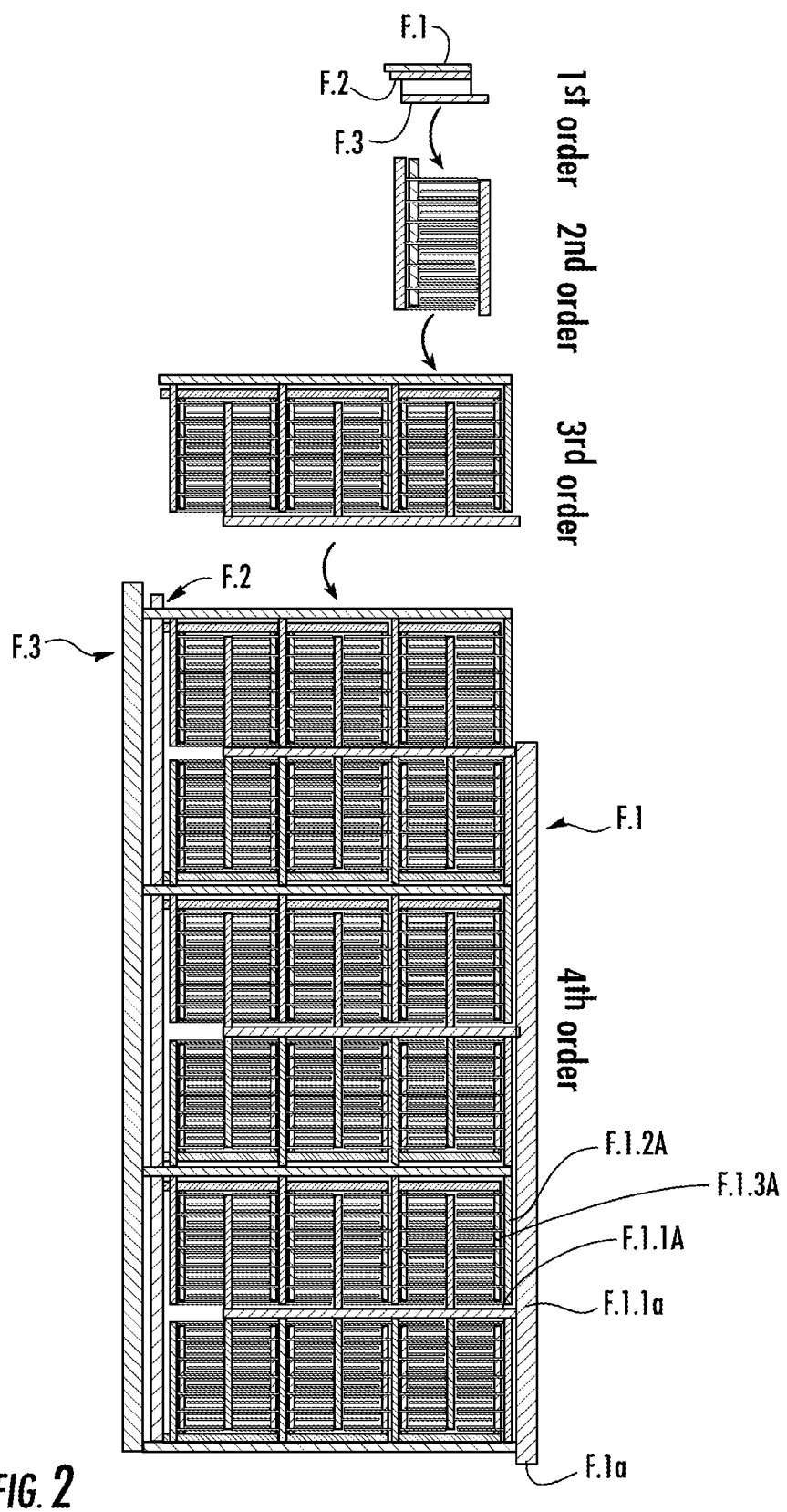
FIG. 2 shows the fractal design of the metallic contact structures of the exemplary embodiment.
Figure 3:
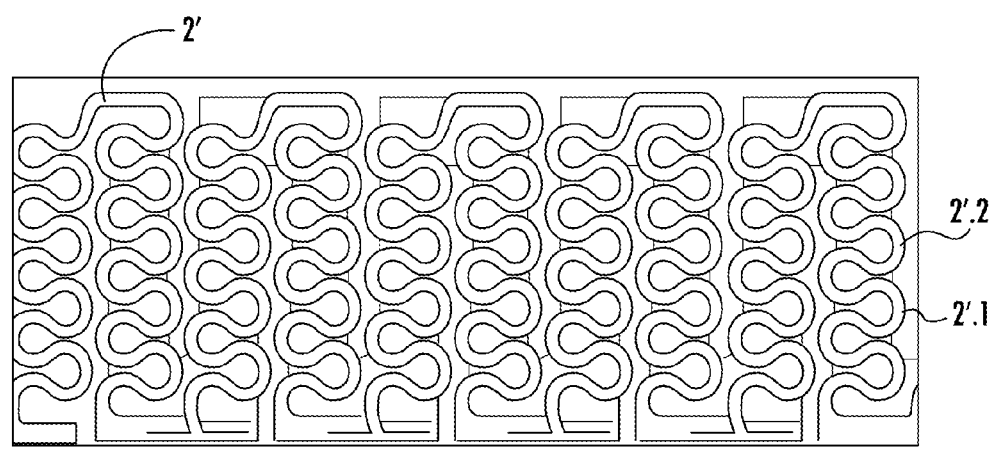
FIG. 3 shows a schematic partial illustration of a second exemplary embodiment of a semiconductor component according to the invention, which semiconductor component is embodied as a transistor and comprises a metallic gate contact structure embodied in the form of meanders strung together.

For reasons of enabling better illustration, a stepped decrease in the width along a subsequent conduction track is not shown in the schematic illustrations in FIGS. 1 to 3. Such a stepped decrease is discussed in detail in FIGS. 4a to 4c and the associated description of these figures.

The transistor in accordance with the first exemplary embodiment is embodied as a power transistor comprising a plurality of subtransistors. In this case, each conduction track of the highest order, the second order in the present case, of the source contact structure 1 is assigned exactly one subtransistor. The active area of such a subtransistor is indicated by way of example by the curly brackets in FIG. 1e: the intersection of the regions indicated by the curly brackets X1 and X2 represents the active area of a first subtransistor, and the intersection of the areas indicated by the curly brackets X1 and X2' correspondingly represents the active area of a second subtransistor. Here second-order subsequent conduction tracks of the contact structures 1 and 3 are in each case assigned to two subtransistors adjoining one another. By way of example, the second-order subsequent conduction track 3.2B is assigned both to the subtransistor X1-X2 and to the subtransistor X1-X2' for feeding in or leading away charge carriers.

In a further exemplary embodiment, with omission of the gate contact structure 2, the contact-making structure illustrated in FIG. 1d can be employed in the case of semiconductor diodes, in particular power diodes, light emitting diodes or photovoltaic solar cells: in this case, the first contact structure 1 typically makes contact with semiconductor regions of a first doping type and the second metallic contact structure 3 typically makes contact with semiconductor regions of a second doping type, opposite to the first doping type. In this case, doping types are the n-type doping and the p-type doping opposite thereto.

In one exemplary embodiment of a photovoltaic solar cell, such a contact-making structure is therefore advantageous in the embodiment of the solar cell as a solar cell contacted on one side, in particular a back contact solar cell. In a further exemplary embodiment of a solar cell contacted on both sides in a typical configuration, the embodiment of a front-side metallization of the solar cell in accordance with the contact structure 1 illustrated in FIG. 1 is advantageous, in particular in order to realize low series resistance losses in conjunction with little shading of the front side.

FIG. 2 schematically illustrates the conceptual design of exemplary embodiments of semiconductor components according to the invention.

Even the exemplary embodiment illustrated in FIG. 1d has self-similar structures, since regions of the contact structures 1 and 3 that are interlaced in one another in a comb-like manner are found again on a coarse scale by virtue of the first-order subsequent conduction tracks (1.1A, 1.1B; 3.1A, 3.1B) and on a smaller scale by virtue of the second-order subsequent conduction tracks (1.2A, 1.2B; 3.2A, 3.2B). The subsequent conduction tracks branch off at the branching points in each case at right angles with respect to the higher-order subsequent conduction tracks, such that the self-similar structures are arranged in each case in a manner rotated by 90° upon a change of scale.

The configuration in accordance with FIG. 1*d* can therefore be designated as third-order fractal.

This is clarified in FIG. 2 by virtue of the fact that, proceeding from a first-order fractal having parallel conduction tracks F.1 of a first contact structure, F.2 of a second contact structure and F.3 of a third contact structure, higher-order fractals, second, third and fourth orders being illustrated, are formed in each case by self-similar mapping. The third-order fractal corresponds to the exemplary embodiment described with regard to FIG. 1*d*. The fourth-order fractal represents a further exemplary embodiment of a semiconductor element according to the invention, correspondingly comprising a source contact structure F.1, a gate contact structure F.2 and a drain contact structure F.3.

These contact structures F.1, F.2 and F.3 are embodied analogously to the illustration in accordance with FIG. 1*d*, but additionally have third-order conduction tracks. By way of example, a contact-making point F.1*a*, a first-order branching point F.1.1*a*, a first-order subsequent conduction track F.1.1A, a second-order subsequent conduction track F.1.2A and a third-order subsequent conduction track F.1.3A are identified with respect to the source contact structure F.1.

The advantages described above are increased again by virtue of this configuration as fourth-order fractal compared with the configuration as third-order fractal.

In a further exemplary embodiment, the conduction tracks and in particular the subsequent conduction tracks are embodied with a through-conduction resistance that decreases in a stepped fashion at each branching point, in particular a width that decreases in a stepped fashion at each branching point, as known per se from so-called "tapered fingers" in the case of conventional comb-like contact-making structures. As a result, along a conduction track the conduction resistance loss and the heat dissipation can advantageously be kept approximately constant in the operating state of the semiconductor component.

FIG. 3 illustrates a further exemplary embodiment of a semiconductor component according to the invention. This exemplary embodiment can, in principle, be embodied analogously to the first exemplary embodiment in accordance with FIG. 1*d*. In contrast to the first exemplary embodiment, however, the gate contact structure is embodied as a gate contact structure 2' in the form of meanders strung together (designated as meanders 2'.1 and 2'.2, for example). As a result, voltage spikes are avoided or at least reduced on account of the roundings of the meanders (2'.1, 2'.2).

Figure 4A:
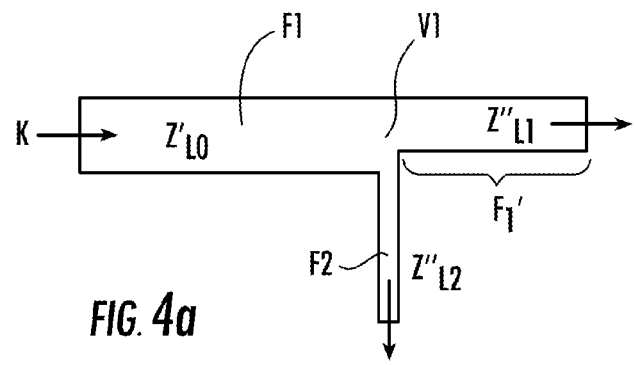
FIGS. 4a to 4c show schematic partial illustrations of subsequent conduction tracks for elucidating the impedance matching.
Figure 4B:
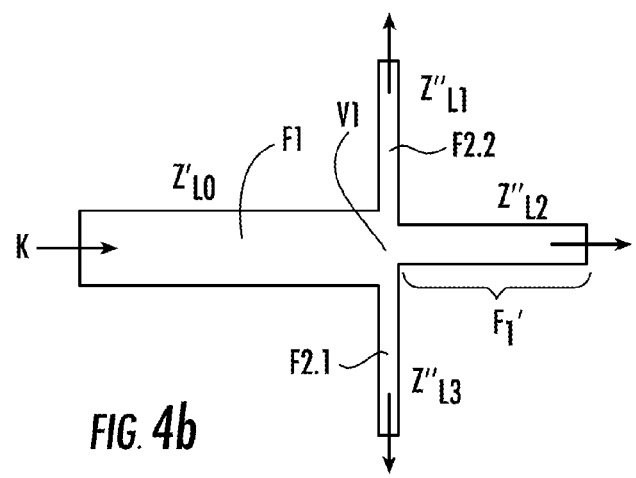
Figure 4C:
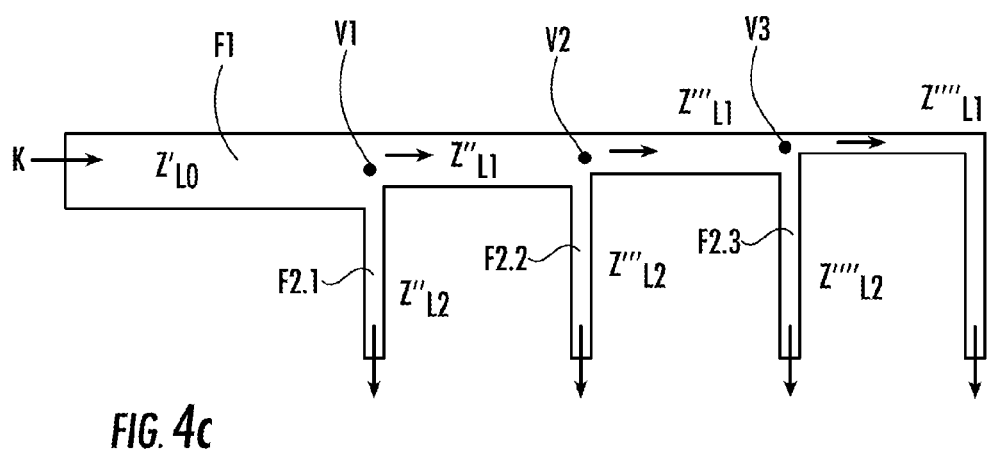

FIGS. 4*a* to 4*c* illustrate schematic partial illustrations of subsequent conduction tracks in three examples a, b and c in order to elucidate the stepwise decrease in width along a subsequent conduction track with application of the above-described condition for impedance matching.

FIGS. 4*a* to 4*c* in each case illustrate a horizontally extending first-order subsequent conduction track F1, which extends horizontally, wherein FIGS. 4*a* and 4*b* only illustrate a partial excerpt, i.e. the first-order subsequent conduction track F1 analogously continues toward the right. On the left-hand side of the subsequent conduction track F1 in each of FIGS. 4*a* to 4*c*, the subsequent conduction track F1 is connected to a contact-making point K—if appropriate via further interposed segments of the subsequent conduction track F1.

In the exemplary embodiment illustrated in FIG. 4*a* the subsequent conduction track of first order track F1 branches at a branching point V1 by virtue of a second-order subsequent conduction track F2 branching off. Furthermore, the subsequent conduction track F1 is continued after the branching point V1 (see marked partial region F1').

Z and corresponding indices identify the impedances of the individual partial regions of the subsequent conduction track F1 and of the second-order subsequent conduction track F2. In order to fulfill the condition in accordance with formula (1) mentioned above, a condition in accordance with formula 2 thus results for the example illustrated in FIG. 4*a*:

$$\frac{1}{Z'_{L0}} = \frac{1}{Z''_{L1}} + \frac{1}{Z''_{L2}}. \quad \text{(formula 2)}$$

If $Z'_{L0}=50\Omega$, for example, then $Z''_{L1}=66.6\Omega$ and $Z''_{L2}=200\Omega$ can be chosen in order to fulfill the condition in accordance with formula (2).

FIG. 4*b* illustrates an exemplary embodiment that differs from the exemplary embodiment in accordance with FIG. 4*a* in that two second-order subsequent conduction tracks F2.1 and F2.2 branch off at the branching point V1. With the designations for the respective impedances as indicated in FIG. 4*b*), the condition in accordance with formula (1) thus results as formula 3 for this exemplary embodiment:

$$\frac{1}{Z'_{L0}} = \frac{1}{Z''_{L1}} + \frac{1}{Z''_{L2}} + \frac{1}{Z''_{L3}}. \quad \text{(formula 3)}$$

If $Z'_{L0}=50\Omega$, for example, then $Z''_{L1}=200\Omega$, $Z''_{L2}=100\Omega$, $Z''_{L3}=200\Omega$ can be chosen in order to fulfill the condition in accordance with formula (3).

FIG. 4*c* shows a further exemplary embodiment, in which, proceeding from the exemplary embodiment in accordance with FIG. 4*a*, the first-order subsequent conduction track F1 has further branching points V2 and V3 with second-order subsequent conduction tracks F2.2 and F2.3 respectively branching off. With analogous application of the condition in accordance with formula (1), for $Z'_{L0}=50\Omega$, for example, the values for $Z''_{L1}=66.6\Omega$, $Z''_{L2}=200\Omega$, $Z'''_{L2}=200\Omega$, $Z'''_{L1}=100\Omega$, $Z''''_{L2}=200\Omega$ and $Z''''_{L1}=200\Omega$ can be chosen in order to fulfill the condition in accordance with formula (1).

One measure of the impedances Z of the associated segments of the subsequent conduction tracks in accordance with FIGS. 4*a* to 4*c* is the respective width of these segments. FIG. 4*c*, in particular, reveals the width of the first-order subsequent conduction track F1 decreasing in a stepped fashion at each of the branching points V1, V2 and V3, which thus brings about the impedance change.

The subsequent conduction tracks in the illustration in accordance with FIG. 1 can be embodied analogously to the illustrations in accordance with FIGS. 4*a* to 4*c* in order to bring about the advantageous impedance matching described. As already explained above, a stepped decrease in the width is not shown in FIG. 1, for reasons of enabling better illustration.

The invention claimed is:
1. A semiconductor component, comprising at least one first contact structure (1, 2, 3, F.1, F.2, F.3) for at least one of feeding in or leading away charge carriers in relation to the semiconductor component, said first contact structure (1, 2, 3, F.1, F.2, F.3) has at least one contact-making point (1$a$, 2$a$, 3$a$, F.1$a$) for electrically conductively connecting the first contact structure (1, 2, 3, F.1, F.2, F.3) to an external terminal, and said first contact structure has at least one first-order branching point (1.1$a$, 1.1$b$, F.1.1.$a$, 2.1$a$, 2.1$b$, 3.1$a$, 3.1$b$) proceeding from the contact-making point, at said first-order branching point at least one first-order subsequent conduction track (1.1A, 1.1B, F.1.1.A, 2.1A, 2.1B, 3.1A, 3.1B) branches off, each said at least one first-order subsequent conduction track has at least one second-order branching point (1.2$a$, 1.2$b$, 2.2$a$, 2.2$b$, 3.2$a$, 3.2$b$), at said second-order branching point at least one second-order subsequent conduction track (1.2A, 1.2B, 2.2A, 2.2B, 3.2A, 3.2A', 3.2B, 3.2B') branches off, wherein an electrical through-conduction resistance of each said second-order subsequent conduction track is higher than an electrical through-conduction resistance of the first-order subsequent conduction track connected to said second-order subsequent conduction track via an associated one of the second-order branching points, and at least one of the following conditions is met:
(a) the through-conduction resistances of the subsequent conduction tracks are chosen such that during operation of the semiconductor component an electrical conduction resistance power loss of each said second-order subsequent conduction track deviates by less than 10% from an electrical conduction resistance power loss of the first-order subsequent conduction track connected to said second-order subsequent conduction track via the associated second-order branching point, and an average electrical conduction resistance power losses of the conduction tracks deviate from one another by less than 10%, or
(b) the through-conduction resistances of the subsequent conduction tracks are chosen such that during operation of the semiconductor component a current density of each said second-order subsequent conduction track deviates by less than 10% from a current density of the first-order subsequent conduction track connected to said second-order subsequent conduction track via the associated second-order branching point, and the average electrical conduction resistance power losses of the subsequent conduction tracks deviate from one another by less than 10%.

2. The semiconductor component as claimed in claim 1, wherein each one of the subsequent conduction tracks is assigned an active partial area (X1-X2, X1-X2') of the semiconductor component and the through-conduction resistance of each said subsequent conduction track is proportional to a square of a reciprocal of the active partial area assigned to said subsequent conduction track.

3. The semiconductor component as claimed in claim 1, wherein an impedance $Z_0$ of a segment of the conduction track between a first one of the branching points and a second one of the branching points is chosen such that a sum of reciprocals of impedances $Z_i$ of the conduction tracks connected in parallel at the second branching point is equal to a reciprocal of the impedance $Z_0$, wherein the segment is delimited by the first branching point (1.2$a$) facing the contact-making point (1$a$) and the second branching point (1.2$b$) facing away from the contact-making point, and wherein the first and second branching points are adjacent.

4. The semiconductor component as claimed in claim 1, wherein each second-order subsequent conduction track has at least one third-order branching point, at said third-order branching point at least one third-order subsequent conduction track branches off, wherein, analogously to a configuration of lower-order subsequent conduction tracks, an electrical through-conduction resistance of each said third-order subsequent conduction track is higher than the electrical through-conduction resistance of the second-order subsequent conduction track connected to said third-order subsequent conduction track via an associated one of the second-order branching points.

5. The semiconductor component as claimed in claim 1, wherein at least two of the second-order subsequent conduction tracks branch off at least at each one of the second-order branching points.

6. The semiconductor component as claimed in claim 1, wherein the first contact structure is embodied in a self-similar fashion at least in partial regions and is embodied as an at least second-order fractal structure.

7. The semiconductor component as claimed in claim 1, wherein the semiconductor component comprises a second contact structure for at least one of feeding in or leading away charge carriers in relation to the semiconductor component, said second contact structure is embodied analogously to the first contact structure in a manner interlaced in one another.

8. The semiconductor component as claimed in claim 1, wherein the semiconductor component is embodied as a transistor.

9. The semiconductor component as claimed in claim 8, wherein the first contact structure is embodied as a drain contact-connection (3) or as a source contact-connection (1) of the transistor.

10. The semiconductor component as claimed in claim 9, wherein the transistor comprises a gate contact structure (2, 2') said gate contact structure is embodied analogously to the first contact structure.

11. The semiconductor component as claimed in claim 8, wherein the transistor is embodied as a power transistor comprising a plurality of subtransistors.

12. The semiconductor component as claimed in claim 8, wherein the transistor is embodied as a radio-frequency transistor, or as a lateral transistor, or both.

13. The semiconductor component as claimed in claim 1, wherein the semiconductor component is embodied as a diode.

14. The semiconductor as claimed in claim 1, wherein at least two n-th order subsequent conduction tracks branch off at each of the branching points having an order n greater than 1.

15. The semiconductor as claimed in claim 7, wherein the first and second contact structures are embodied as an at least third-order fractal structure proceeding from an interdigitated double comb structure as a second-order basic structure.

16. The semiconductor component as claimed in claim 3, wherein the semiconductor component is a transistor, and the first contact structure is embodied as a drain contact-connection (3) and the second contact structure is embodied as a source contact-connection (1) of the transistor.

17. The semiconductor component as claimed in claim 9, wherein the transistor comprises a gate contact structure, and said gate contact structure (2') is embodied at least regionally in a form of meanders (2'.1, 2'.2) strung together.

18. The semiconductor component of claim 11, wherein each said conduction track of the highest order of the first contact structure is assigned one subtransistor.

* * * * *